United States Patent [19]

Tompsett

[11] 4,126,794

[45] Nov. 21, 1978

[54] SEMICONDUCTOR CHARGE COUPLED DEVICE WITH SPLIT ELECTRODE CONFIGURATION

[75] Inventor: Michael F. Tompsett, New Providence, N.J.

[73] Assignee: Bell Telephone Laboratories, Incorporated, Murray Hill, N.J.

[21] Appl. No.: 818,411

[22] Filed: Jul. 25, 1977

[51] Int. Cl.² .................. G11C 19/28; H03H 7/28; H01L 29/78; H01L 29/04
[52] U.S. Cl. .................. 307/221 D; 357/24; 357/59; 333/70 T
[58] Field of Search .................. 357/24; 307/221 D; 333/70 T

[56] References Cited

U.S. PATENT DOCUMENTS

| 4,005,377 | 1/1977 | Engeler | 357/24 |
| 4,075,514 | 2/1978 | Sequin | 307/221 D |

OTHER PUBLICATIONS

Ibrahim et al., "CCD's for Tranversal Filter Applications" IEEE Int. Electron Devices Meeting (12/74) Technical Dig., pp. 240–243.
Ibrahim et al., "Multiple Filter Characteristics Using a Single CCD Structure" Int. Conf. Application Charge-Coupled Devices, San Diego (10/75), Proc. pp. 245–247.
Sequin & Tompsett, Charge Transfer Devices, Academic Press, N.Y. (7/75) pp. 42–44.

Primary Examiner—William D. Larkins
Assistant Examiner—Gene M. Munson
Attorney, Agent, or Firm—David I. Caplan

[57] ABSTRACT

A semiconductor charge coupled device (CCD) with split electrode charge sensors contains a localized connecting impurity doped region, of opposite conductivity type from that of the semiconductor transfer sites, underlying the gap between each pair of split electrodes; and each such connecting region is contiguous with both transfer sites underlying each pair of split electrodes, thereby serving to equilibrate the potentials of both such transfer sites. The entire downstream edge of each of these connecting regions is bounded by a separate localized channel stopping auxiliary barrier region of higher threshold than that of the charge transfer channel, in order to suppress dynamic signal charge transfer inefficiency caused by spurious contributions of charge from the connecting regions to the propagating signal charge packets.

10 Claims, 1 Drawing Figure

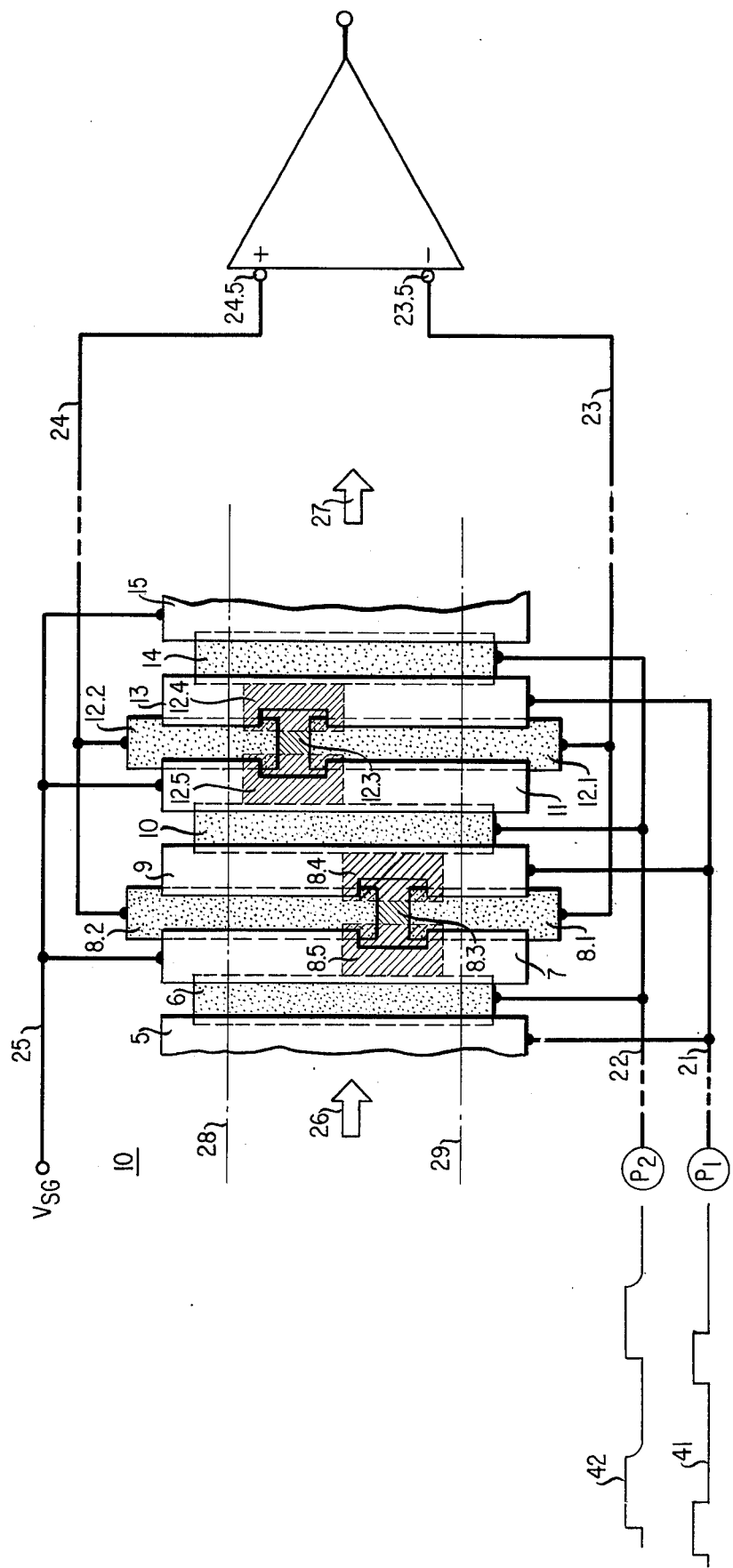

SEMICONDUCTOR CHARGE COUPLED DEVICE WITH SPLIT ELECTRODE CONFIGURATION

1. Field of the Invention

This invention relates to the field of semiconductor apparatus, and more particularly to semiconductor charge coupled devices.

BACKGROUND OF THE INVENTION

In U.S. Pat. No. 4,005,377, issued to W. E. Engeler on Jan. 25, 1977, a semiconductor charge coupled device (CCD) with split electrode charge sensors is disclosed in which the semiconductor region underlying each gap between each pair of split electrodes contains a localized impurity region connecting the semiconductor transfer sites underlying each pair of split electrodes. Each of these connecting regions is of opposite conductivity type from that of the transfer sites and serves to equilibrate the potentials during operation of both transfer sites underlying each pair of split electrodes. However, these connecting regions undesirably serve as variable sources of spurious signal charge depending upon the size of the signal charges. This phenomenon results in an undesirable dynamic modulation effect, which is equivalent to a dynamic charge transfer inefficiency; and thereby the overall performance characteristic of the CCD is degraded.

SUMMARY OF THE INVENTION

In order to suppress the effect of the connecting impurity region acting as a source of spurious signal charge, an auxiliary localized "barrier" region of higher threshold bounds at least the charge output ("downstream") edge of each localized connecting impurity region. The higher threshold (channel stopping) barrier region can be obtained by means of a thicker overlying oxide or a more highly doped auxiliary impurity region of opposite conductivity type from that of the connecting region, i.e., the same conductivity type (but higher electrical conductivity) as that of the transfer sites, or by means of both such thicker overlying oxide and more highly doped auxiliary region. Advantageously, the threshold voltage in each such barrier region is sufficiently high that, during operation, no inversion occurs therein. In addition, for purposes of symmetry and in order to correct for misalignment, the charge input "upstream" edge of the connecting region is also bounded by a thicker overlying oxide or a more highly doped auxiliary barrier region of opposite type from that of the connecting region, or both. Moreover, in order to ensure proper contiguity of the edge boundary of the connecting region with that of the auxiliary barrier region(s), the next neighboring transfer electrodes adjacent to each of the sense electrodes are formed with notches, thereby also reducing the undesirable parasitic coupling capacitance of these transfer electrodes with respect to the connecting regions.

In a specific embodiment of the invention, a CCD in a split electrode transversal filter configuration contains four types of electrodes per transfer stage: a first clock phase electrode, a second clock phase electrode, a shield gate (constant applied voltage), and a split electrode pair containing an insulating gap between the two electrodes of the pair. Each of the two electrodes of each such split electrode pair serves as a signal charge sense electrode and has a predetermined length in accordance with the desired predetermined charge signal processing weight ("tap weight"). The channel region of the semiconductor, where signal charge propagation transfer takes place, is P-type monocrystalline silicon for the presently preferred "N-channel" device in which the signal charges are electrons (rather than holes). In each of the subregions of this channel underlying the gaps between split electrode pairs, there is a N+ (strongly doped N-type) connecting region extending in the semiconductor from directly underlying one electrode to the other of each pair; this N+ connecting region is contacted along its entire upstream and downstream edges by auxiliary P+ barrier regions, in order to provide potential barriers at these edges against the movement of electron charge carriers out of the N+ connecting region. While each of the N+ connecting regions in an N-channel device produces an easy (no barrier) electrical path enabling the transfer of charge carriers from one transfer site to another through these N+ connecting regions, each of the P+ regions produces a potential barrier against such charge transfer. In addition, the oxide insulating layer overlying the auxiliary P+ barrier region is significantly thicker thereat then elsewhere overlying the transfer channel, in order to ensure even further against the movement of electron charge carriers out of the connecting region. On the downstream side of each split electrode pair is located a different first clock phase electrode, whereas on the upstream side of each split electrode pair is located a different shield gate electrode. Each such shield gate electrode and each such first clock phase electrode is notched on its edge proximate to the split electrode in a region overlying the auxiliary P+ region, thereby increasing the distances of closest approach (and hence reducing the capacitance) of both the shield gate and first clock phase electrode relative to the N+ connecting region than would otherwise be the case in the absence of such notches (i.e., than in the case of electrodes of uniform width parallel to the charge transfer direction.)

BRIEF DESCRIPTION OF THE DRAWING

This invention, together with its features, objects, and advantages, may be better understood from the following detailed description when read in conjunction with the drawing in which:

The FIGURE is a top-view diagram of a semiconductor charge coupled device in a split electrode transfer filter configuration in accordance with a specific embodiment of the invention.

Only for the sake of clarity, none of the drawing is to be scale.

DETAILED DESCRIPTION

The FIGURE shows two complete stages of an "N-channel" semiconductor charge coupled device in a split electrode transversal filter configuration 10. More specifically, these stages include shield gate electrodes 7, 11, and 15; first clock phase ($P_1$) driven electrodes 5, 9, and 13; second clock phase ($P_2$) driven electrodes 6, 10, and 14; and split electrode pairs 8.1, 8.2 and 12.1, 12.2 (that is, electrodes split into two segments, for sensing the charge packets during operation. As known in the art, each of the electrodes is in an overlapping relationship with respect to its nearest neighboring electrodes on both sides, that is, both the charge transfer "upstream" (left-hand) edge and the "downstream" (right-hand) edge. The direction of the flow of charge packets is from left to right, that is, from an input charge packet means 26, for injecting charge packets into the charge transfer channel (to be defined below) is accordance with a signal, to an output charge packet means 27, for collecting the charge packets from the channel after propagating therethrough, as known in the art. As known in the art, all electrodes are located in an oxide insulating layer on a major surface of a silicon semiconductor body. The electrodes are thus insulated from the underlying semiconductor surface by the oxide; and this oxide is thinner between electrode and semiconductor in the region between the dotted lines 28 and 29 than outside this region, in order to define the charge transfer channel for charge packet propagation in the left-to-right ("longitudinal") direction in the semiconductor between these dotted lines 28 and 29. All electrodes extend across the entire charge transfer channel, except for the gaps between segments of the split electrodes.

The external connections to the device 10 are as follows. A shield electrode metallization line 25 terminates in a terminal for application to all shield gate electrodes of a voltage bias source $V_{SG}$, typically of about $+8$ volts for an "N-channel" device (electron charge carriers propagating in a P-type semiconductor charge transfer channel). A first clock phase line 21 terminates in a first clock phase voltage source $P_1$ for application to all the first clock phase electrodes of a first clock phase pulse voltage sequence 41, typically of about $+5$ volts passive phase and of about $+13$ volts active phase for an N- channel device. A second clock phase line 22 terminates in a second clock phase voltage source $P_2$ for application to all the second clock phase electrodes of a second clock phase pulse voltage sequence 42, typically of about $+5$ volts passive phase and $+17$ volts active phase for an N-channel device.

The lower segments 8.1, 12.1 of each of the split electrodes are connected together by a first sense electrode line 23 to a first sense electrode terminal 23.5, typically the negative input terminal of a differential sense amplifier. The upper segments 8.2, 12.2 of each of the split electrodes are connected together by a second sense electrode line 24 to a second sense electrode terminal 24.5, typically the positive input terminal of the differential sense amplifier. Further details of a similar sense amplifier and it operation may be found, for example, in a paper by Y. P. Tsividis and P. R. Gray, published in IEEE *Journal of Solid State Circuits*, Vol. SC-11 (December 1976), pp. 748-753. It should be understood, however, that other known sensing techniques can be used for the purpose of detecting the output of the split electrode charge coupled device configuration 10.

The shaded areas in the FIGURE represent impurity doped regions at the surface of the underlying semiconductor. More specifically, for an N-channel device, shaded regions 8.3 and 12.3 are N+ type conductivity surface connecting regions in the P-type semiconductor underlying the gaps between the split electrodes 8.1, 8.2 and 12.1, 12.2. These N+ connecting regions extend in the direction transverse to the charge packet transfer direction underneath the gap all the way from one segment to the other segment of each corresponding split electrode. In this way, each of these N+ connecting regions is of sufficient transverse extent to connect the two charge transfer sites underlying the two electrode segments of each split electrode pair, in order to provide a barrier-free equilibration path for the charge packets in the two transfer sites of each pair.

The shaded regions 8.4, 8.5 and 12.4, 12.5 are P+ conductivity surface barrier regions in the underlying semiconductor. Thus, these P+ regions are of the same conductivity type as that of the silicon substrate but are of much higher electrical conductivity. Also, ease of fabrication, using electrodes as masks, and to minimize the effects of misalignment, makes it advantageous that the longitudinal extent of each such barrier region be limited, on the side away from the N+ connecting region, by the outer contour of an electrode. Thus, for example, the left-hand edge of the second clock phase electrode 10 delimits the right-hand edge of the P+ barrier region 8.4. This P+ barrier region 8.4 is contiguous along the entire downstream (right-hand) edge of the N+ connecting region 8.3. The purpose of this P+ region is to act as a barrier against a signal dependent injection of charges out of the N+ region 8.3 into the transfer site underneath first clock phase electrode 9 during operation. Thus, during operation, charges in the N+ connecting region 8.3 must overcome a constant potential barrier between the N+ region 8.3 and the transfer sites under the split electrode segments 8.1 and 8.2, obtained by the longer and circuitous path around the barrier region 8.4, which poses an even higher barrier, in order to enter the charge packet stream. Accordingly, in order for this path to indeed be relatively long, the P+ barrier region 8.4 advantageously extends at least about a distance in the direction transverse to the charge transfer propagation direction equal to the width of the gap between the electrode segments 8.1 and 8.2. The P+ barrier region 8.5 located on the upstream edge of the connecting region 8.3 is for purposes of alignment and symmetry. For ease of fabrication, the barrier region 8.4 extends downstream only to the upstream edge of the second clock phase electrode 10. It should be understood, of course, that the P+ barrier regions 12.4 and 12.5 are similar in relation to the N+ connecting region 12.3 as are the P+ barrier regions 8.4 and 8.5 in relation to the N+ connecting region 8.3.

Typically, the P-type silicon semiconductor material in the charge transfer channel contains an excess significant acceptor impurity concentration of the order of $7 \times 10^{14}$ cubic centimeter, the N+ connecting regions contain an excess significant donor impurity concentration at the surface of the order of $2 \times 10^{16}$ per cubic centimeter, and the P+ barrier regions contain an excess significant acceptor impurity concentration of the order of $2 \times 10^{16}$ per cubic centimeter. Moreover, each P+ barrier region extends beyond the adjacent N+ connecting region, in the direction transverse to the charge transfer (or propagation) direction, for at least about a gap width on both edges of the N+ connecting region, in order to ensure a suitably geometrically complete barrier against the flow of charges out of the N+ connecting region. Thus, the transverse width of each P+ barrier region is at least about three times the width of the gap.

In order to fabricate the device 100, a process including the following steps is illustrative. A first layer of silicon dioxide, typically about 500 angstroms thick, is grown all over a major surface of a P-type monocrystalline silicon semiconductor body. Then a layer of silicon nitride, typically about 1200 angstroms thick, is formed on the entire exposed surface of the silicon dioxide; and a second layer of silicon dioxide, typically about 500 angstroms thick, is deposited over the entire exposed surface of the silicon nitride. Next, a photoresist layer, with apertures overlying those semiconductor regions where the P++ barrier regions are to be formed, is disposed over the exposed surface of the second silicon dioxide layer; and those portions of the second oxide layer in the apertures are selectively removed, as by etching. Acceptor impurities, such as boron, are then introduced through these apertures, to form the desired P+ barrier regions, as by ion implantation. The photoresist layer is then removed, and then those portions of the silicon nitride layer which are now exposed (i.e., in the apertures of the photoresist layer now removed) are removed, as by etching with a solution which dissolves silicon nitride but not the oxide. Next, an oxidation process in steam is used to grow silicon dioxide, typically 8,000 angstroms thick, over those regions where there is no nitride shielding the underlying silicon (i.e., in the complement of the removed photoresist layer). Thereby, the desired thick oxide, useful as a channel stop, is disposed in registry over the P+ barrier regions. Then an oxide etching solution is used for a sufficient time to dissolve slightly more than 500 angstroms of silicon dioxide, thereby removing completely the oxide layer overlying the silicon nitride but not removing the bulk of the 8,000 angstrom thick oxide, so that this latter oxide is still sufficiently thick to serve as a channel stop. Next the exposed silicon nitride is removed by an etching solution which does not dissolve the oxide; and then another slightly more than 500 angstroms of oxide are etched away by exposure to a solution which etches silicon dioxide, thereby exposing the silicon semiconductor surface in regions removed from the thick channel stop oxide (which still remains, being considerably more than 500 angstroms thick). Then a high quality gate oxide is thermally grown on the exposed silicon semiconductor surface. Next, polysilicon electrodes for the "first level of metallization" (electrodes 6, 8.1, 8.2 10, 12.1, 12.2, 14) are laid down, as known in the art, with suitable gaps between the electrodes of every pair of split electrodes. Using these polysilicon electrodes as masks against diffusion, donor impurities, such as phosphorus, are introduced by ion implanation into the semiconductor in all the regions underlying these gaps; thereby the N+ connecting regions are formed. The outer edges of each connecting N+ region are determined in the CCD charge transfer direction by a boundary of the thick oxide, and thus by a boundary of each of the P+ barrier regions on both sides of each gap; while the outer edges of each of these N+ connecting regions in the transverse direction are determined by the extent of the gap between the corresponding split electrode, i.e., is self-aligned with the gap. Then the "second level metallization" (electrodes 5, 7, 9, 11, 13, 15) are formed of polysilicon, as known in the art, but with notches (as indicated in the drawing) in the neighborhood of the split electrode gaps, in order to reduce the capacitance between these electrodes and the adjacent N+ connecting regions. These notches can be formed by suitable notches in the mask pattern used for the formation of these notched electrodes.

Although the invention has been described in terms of a specific embodiment, various modifications may be made without departing from the scope of the invention. For example, a P-channel CCD can be made by interchanging P with N, acceptor impurity with donor impurity, as known in the art. Also, the barrier regions can be provided solely by means of overlying thicker oxide regions or solely by means of the doped P+ regions rather than by both such means. Also, in some other fabrication techniques, it may be desirable that the P+ barrier regions be more highly doped than the N+ connecting regions, in order to ensure suitable channel stopping particularly in the absence of the use of a thick overlying channel stop oxide or to ensure proper mutual alignment of the boundary between the N+ connecting and P+ barrier regions. Finally, the invention is also applicable to bulk channel CCD split-electrode filters as well as the surface channel device described above in detail.

What is claimed is:

1. In a semiconductor apparatus comprising a semiconductor charge coupled device having a transfer channel of one conductivity type, an electrode pair separated by a gap extending transversely across the entire channel except for said gap, a connecting region of opposite conductivity type in the semiconductor region underlying said gap, a signal charge packet input means and a charge packet output means, respectively, for injecting charge packets into the device and for collecting charge packets from the device after transfer through the channel in a downstream direction in response to clock phase voltage pulses applied to at least one electrode extending across the entire channel proximate to said electrode pair:
   a localized barrier region, located in said transfer channel, characterized by a higher electrical threshold voltage than that of said channel, said barrier region being contiguous with an entire first edge of the connecting region on the downstream side of said connecting region and being noncontiguous with second and third edges of said connecting region perpendicular to the first edge.

2. In semiconductor apparatus comprising a semiconductor charge coupled device having a transfer channel of one conductivity type overlain by an electrode pair separated by a gap, said electrode pair extending across the entire channel except for said gap, with a connecting region of opposite conductivity type in the semiconductor region underlying said gap, said device further having at least first and second clock phase driven electrodes sufficiently proximate to said electrode pair for inducing the transfer of charge packets through said channel in a charge transfer downstream direction in response to first and second clock phase voltage pulse sequences applied, respectively, to said first and second clock phase driven electrodes:
   a pair of localized barrier regions, each located in said transfer channel, each characterized by a higher electrical threshold voltage than that of said transfer channel, one of said barrier regions being contiguous with the entire charge transfer upstream edge opposite the downstream edge of said connecting region and other of said barrier regions being contiguous with the downstream edge of the said connecting region, both of said barrier regions being noncontiguous with the said connecting region along the edges thereof transverse to said upstream edge.

3. In a semiconductor device according to claim 1:
   another charge transfer electrode extending entirely across the said channel, each of the electrodes in said pair located in overlapping relation with the charge transfer upstream edge of said another electrode, the downstream edge of said another electrode extending in the downstream direction beyond the downstream boundary edge of said barrier region.

4. A semiconductor charge coupled device in a semiconductor body comprising:
   (a) a charge transfer channel of conductivity type in a semiconductor body having input charge packet means for injecting charge packets into the channel in accordance with a signal and output charge packet means for collecting charge packets from the channel;
   (b) a plurality of charge transfer electrodes overlying said charge transfer channel for transferring charge packets along said channel in a downstream direction, at least one of said electrodes being split into a first and a second segment with a gap therebetween, a localized connecting region of opposite conductivity type underlying a portion of said gap for electrically coupling the pair of charge storage regions in the transfer channel underlying said first and second segments; and
   (c) a first localized barrier region of said one conductivity type and of higher threshold voltage than that of said transfer channel located contiguous with the entire charge transfer downstream edge of said connecting region, for suppressing the flow of charge out of the downstream edge of said connecting region during operation, said barrier region being noncontiguous with the edges of the connecting region perpendicular to said downstream edge.

5. A semiconductor charge coupled device according to claim 4 which further comprises a second localized barrier region of said one conductivity type and of higher threshold voltage than that of said channel located contiguous with the entire upstream edge of said connecting region.

6. A semiconductor body including a transversal filter charge coupled device which comprises a first plurality of charge transfer stages, each stage having a second plurality of charge transfer electrodes overlying a portion of a major surface of the semiconductor body, thereby defining a charge transfer channel in the body of one conductivity type whereby charge packets can be transferred through said channel in a charge transfer downstream direction from input charge injection means to output charge collection means in response to clock phase voltages applied to the charge transfer electrodes in each stage, each stage containing a different sense electrode overlying said channel and each said sense electrode being split into a first and a second segment thereby defining a gap therebetween, a separate localized connecting region of opposite conductivity type underlying a portion of each of said gaps for coupling electrically the pair of charge storage regions underlying the first and second segments of respective ones of said sense electrodes, and a separate first localized barrier region of the said one conductivity type and of higher threshold voltage than that of said transfer channel contiguous with the entire charge transfer downstream edge of each of said connecting regions for suppressing the downstream flow of charges from said connecting regions, each said barrier region being noncontiguous with the edges of each connecting region perpendicular to the downstream edge thereof.

7. A device according to claim 6 in which the said first barrier region extends in the direction transverse to the charge transfer direction for a distance beyond the transverse extremities of the gap which is equal to at least about the width of said gap in said transverse direction.

8. A device according to claim 7 which further comprises a separate second localized barrier region in each stage, of the same threshold voltage and the same conductivity type as those of the first barrier region, located contiguous with the entire upstream edge of each of the said connecting regions.

9. A device according to claim 7 in which the charge transfer electrodes in each stage include first and second different clock phase driven electrodes located in mutually next neighboring spatial sequence next neighboring on the downstream side of said sense electrode in said stage and in which the charge transfer downstream edge of each of said first barrier regions is closer to its upstream edge than the projection onto the channel of the downstream edge of the next neighboring first electrode located on downstream side of said electrode of the second plurality.

10. A device according to claim 8 in which each of the second barrier regions extends in the direction transverse to the charge transfer propagation direction for at least about a width of the gap beyond the transverse extremities of the gap.

* * * * *